United States Patent [19]
Swain

[11] 4,427,723
[45] Jan. 24, 1984

[54] METHOD AND APPARATUS FOR LASER-STIMULATED VACUUM DEPOSITION AND ANNEALING TECHNIQUE

[75] Inventor: David M. Swain, Thousand Oaks, Calif.

[73] Assignee: Rockwell International Corporation, El Segundo, Calif.

[21] Appl. No.: 347,741

[22] Filed: Feb. 10, 1982

[51] Int. Cl.³ .................. B05D 3/06; B05D 5/00; C23C 13/08
[52] U.S. Cl. ..................... 427/53.1; 118/50.1; 118/641; 219/121 LS; 219/121 LT
[58] Field of Search ............... 427/53.1; 219/121 LS, 219/121 LT; 118/50.1, 641

[56] References Cited

U.S. PATENT DOCUMENTS 3,957,474 5/1976 Kobayashi et al. ............ 427/53.1 X
4,281,030 7/1981 Silfvast ............................ 427/53.1 X

*Primary Examiner*—Michael R. Lusignan
*Attorney, Agent, or Firm*—H. Fredrick Hamann; Harry B. Field

[57] ABSTRACT

A method and apparatus for vacuum deposition and annealing wherein specimens 18 and 20 of coating material within a vacuum chamber 2 are evaporated by a laser beam 24, while the substrate 16 is scanned by another laser beam 36 to cause localized heating of the substrate and deposited coating materials to an energy slightly below the bonding energy of the coating materials to promote annealing of the coating materials and to drive off contaminant materials.

7 Claims, 1 Drawing Figure

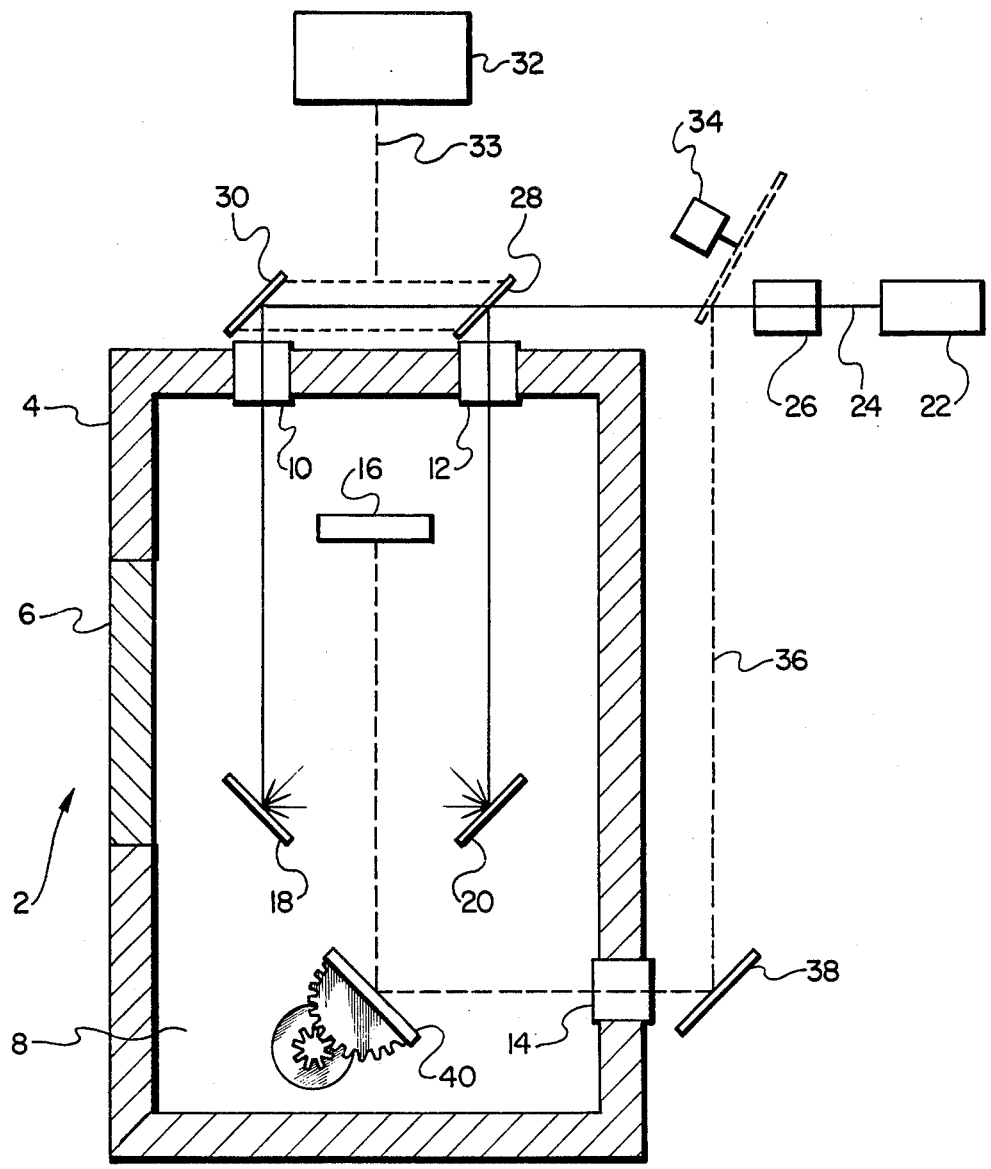

METHOD AND APPARATUS FOR LASER-STIMULATED VACUUM DEPOSITION AND ANNEALING TECHNIQUE

The Government has rights in this invention pursuant to Contract No. F29601-80-C-0041 awarded by the U.S. Department of the Air Force.

BACKGROUND OF THE INVENTION

1. Field of the Invention

This invention relates to coating techniques, and is particularly directed to an improved method and apparatus for annealing thin-film coatings.

2. Description of the Prior Art

The concept of coating a substrate with a layer of a different material has long been known as a technique for protecting the substrate from deleterious conditions or for improving the appearance, performance, or cost of the resulting article. Thus, for example, it has been found that articles can be formed rapidly and cheaply out of plastic, and can be coated to simulate metal articles which would be much more expensive. Alternatively, articles can be formed of inexpensive, easily worked substrates and can be coated to provide improved thermal or electrical properties or other desired characteristics.

Unfortunately, many coating techniques require deposition of two or more materials to form the coating and, often, chemical interaction between the deposited materials is required in order to obtain the desired results. In view of this, considerable care and accuracy must be given to assure that the proper proportions of the respective ingredients are achieved and, frequently, special treatment of the deposited materials is needed to cause desired combining of the deposited materials to form the desired coating.

One major problem of such coating techniques is that of preventing contaminant materials from becoming deposited on the substrate to reduce or destroy the effectiveness of the resulting coating. To overcome this problem, deposition processes are frequently carried out in vacuum chambers, and many methods and apparatus for performing vacuum deposition have been proposed. However, with all of the prior-art vacuum deposition techniques, it has been difficult or impossible to monitor the deposition process while it was being carried out. Therefore, where precision coating is required, it has been necessary to perform the vacuum deposition process in a series of steps interspersed with inspection periods. Obviously, this procedure requires repeated charging and discharging of the vacuum chamber, which is expensive and time-consuming and may, in itself, cause defects in the coating. As a result, the general practice of the prior art has been to ignore monitoring of the deposition process and to rely, instead, upon monitoring the rate of discharge of the materials to be deposited from their respective sources. However, this is an indirect indication of deposition, at best, and provides no means for detecting or eliminating contaminant materials.

Another problem of prior art vacuum deposition techniques arises when it is necessary or desirable to apply heat to enhance attachment of the deposited materials to the substrate, to promote chemical interaction of the deposited materials with other deposited materials or with the substrate, or to anneal the coating materials and to drive off contaminant materials. Unfortunately, such heat treatment frequently requires the use of high temperatures which may be above the melting point of many potential substrate materials, while many other materials may crack or become warped when exposed to such high temperatures. Thus, may candidate substrate materials must be eliminated when such heat treatment is required.

BRIEF SUMMARY AND OBJECTS OF THE INVENTION

These advantages of the prior art are overcome with the present invention, and a method and apparatus for applying thin coatings is proposed which permits extremely accurate control of the discharge rate of the coating materials and which provides continuous, accurate monitoring and control of the deposition ratios of the coating materials and permits constant monitoring and removal of contaminant materials.

The advantages of the present invention are preferably attained by providing a vacuum coating and annealing technique wherein an article to be coated is placed in a vacuum chamber together with specimens of one or more desired coating materials. A plurality of windows are provided in the walls of the vacuum chamber and one or more laser beams are directed through the windows so as to be incident on the coating material specimens to cause controlled evaporation of the coating material. Meanwhile, another laser beam is directed through a window of the vacuum chamber and is reflected by a suitable scanning mirror to cause the reflected laser beam to scan the substrate to permit controlled localized heating of the deposited materials and/or the substrate to facilitate bonding of the coating materials to the substrate, to promote chemical reaction of the coating materials with each other and/or the substrate, to promote annealing of the coating materials by heating the deposited materials to a temperature slightly below their bonding temperature, and/or to drive off contaminant materials from the substrate and coating materials.

Accordingly, it is an object of the present invention to provide a method and apparatus for vacuum coating and annealing articles.

Another object of the present invention is to provide a method and apparatus for vacuum coating which permit accurate monitoring and controlled evaporation of the materials to be deposited on the substrate.

A further object of the present invention is to provide a method and apparatus for vacuum coating wherein the substrate is continuously scanned to monitor and control the deposition of coating materials thereon, to permit annealing of the coating materials, and to drive off contaminant materials.

A specific object of the present invention is to provide a method and apparatus for vacuum coating wherein an article to be coated is placed in a vacuum chamber together with specimens of one or more desired coating materials, a plurality of windows are provided in the walls of the vacuum chamber and one or more laser beams are directed through the windows to be incident on the coating material specimens so as to cause controlled evaporation of the coating material.

Another specific object of the present invention is to provide a method and apparatus for annealing a thin-film vacuum-deposited coating by providing a window in the wall of the vacuum chamber, directing a laser beam through the window during the vacuum-deposition operation, and reflecting the laser beam by a suitable scanning mirror to cause the reflected beam to scan the substrate to permit controlled localized heating of the deposited materials to a temperature slightly below the bonding temperature of the deposited materials.

These and other objects and features of the present invention will be apparent from the following detailed description, taken with reference to the accompanying drawing.

BRIEF DESCRIPTION OF THE FIGURE

The FIGURE is a diagrammatic representation of a vacuum deposition chamber embodying the present invention.

DETAILED DESCRIPTION OF THE PREFERRED EMBODIMENT

In that form of the present invention chosen for purposes of illustration, the FIGURE shows a vacuum deposition chamber, indicated generally at 2, having walls 4 formed with a door 6, providing access to the interior 8 of the vacuum chamber 2, and a plurality of windows 10, 12 and 14 to provide optical pathways through the walls 4. The substrate 16 is supported, in any desired manner, within the interior 8 of the vacuum chamber 2 and one or more specimens of desired coating materials are also mounted within the chamber 2, as seen at 18 and 20. The specimens 18 and 20 are positioned in alignment with windows 10 and 12, respectively. A laser 22 is positioned to emit a beam 24 through a suitable beam expander 26 to suitable means, such as mirror 28, which directs the beam 24 through window 12 to be incident on specimen 20 to cause evaporation of the material of specimen 20 for deposition on the substrate 16. Subsequently, mirror 28 may be moved to the position, 30 shown by dashed lines, to direct beam 24 through window 10 to cause evaporation of the material of specimen 18. If desired, suitable control means 32, such as a timer motor, may be provided, acting through control link 33, to control the movement of the mirror between positions 28 and 30. An optical chopper 34 serves to periodically interrupt the laser beam 24 and to reflect the interrupted portions 36 of the beam 24 toward a mirror 38 which reflects the beam portion 36 through window 14 into the interior 8 of the vacuum chamber 2 where a scanning mirror 40 causes the beam portions 36 to scan the surface of the substrate 16.

In use, substrate 16 and specimens 18 and 20 are placed in the interior 8 of the vacuum chamber 2 and a suitable vacuum is drawn. Thereafter, laser 22 is turned on and emits beam 24, which passes through beam expander 26 and is reflected by mirror 28 through window 12 to be incident on specimen 20. The energy of the laser beam 24 evaporates the material of specimen 20 which migrates to substrate 16 and becomes deposited thereon. Subsequently, control means 32 moves mirror 28 to position 30, causing laser beam 24 to be reflected through window 10 to be incident on specimen 18 and, hence, to cause evaporation of the material of specimen 18 for deposition on substrate 16.

It will be apparent that the time interval during which the laser beam 24 is incident on specimen 20, before mirror 28 is moved to position 30, and the time interval during which the laser beam 24 is incident on specimen 18, before the mirror is returned to position 28, may be varied as desired. Alternatively, a partially-silvered mirror could be placed at position 28 and a full-silvered mirror could be placed at position 30 to permit simultaneous evaporation of specimens 18 and 20. As another alternative, separate lasers could be provided with each of these layers supplying a beam through a respective one of the windows 10 and 12 so that each beam would be incident on a respective one of the specimens 18 and 20. These lasers could be energized either sequentially or simultaneously, and their individual intensities could be varied as desired to control the rate and ratio of evaporation of the specimens 18 and 20.

The annealing technique of the present invention is unique and may be used with coating methods other than that disclosed above. As shown, chopper 34 intermittently interrupts laser beam 24 and directs the intermittent beam 36 to mirror 38 which reflects the beam 36 to the scanning mirror 40. The intensity of laser 22, the chopping rate of chopper 34, and the scanning action of scanning mirror 40 cooperate to determine the intensity and duration of application of the beam 36 on any given area of the substrate 16, and it will be apparent that these can be varied to achieve substantially any desired result. In the preferred annealing technique, these factors are adjusted so as to cause beam 36 to scan the substrate 16 in such a way as to produce localized energization or heating of the deposited materials from specimens 18 and 20 to an energy level slightly below that required for bonding the deposited materials. This energization or heating causes agitation of the deposited ions which enhances annealing of the deposited materials and, at the same time, serves to drive off ions of contaminant materials. This is accomplished because the heating and agitation promotes mixing of the deposited ions and promotes bonding by valence. Furthermore, because of the extremely limited area of the substrate 16 which is subjected to heating by the beam 36 at any given time, thermal stresses within the substrate 16 are minimized and, consequently, the list of candidate substrate materials can be greatly expanded beyond those which can be used with prior-art annealing techniques.

Obviously, numerous variations and modifications can be made without departing from the present invention. Accordingly, it should be clearly understood that the forms of the present invention described above and shown in the accompanying drawing are illustrative only, and are not intended to limit the scope of the present invention.

What is claimed and desired to be secured by Letters Patent of the United States is:

1. Coating apparatus comprising;
   a vacuum chamber having at least one window providing an optical pathway through the walls of said chamber;
   first support means for supporting a substrate within said chamber;
   second support means for supporting a specimen of coating material within said chamber;
   means for evaporating at least a portion of said specimen to provide a coating on said substrate;
   scanning means for causing a beam of light incident thereon to be reflected in a manner to scan the coating on said substrate;
   means directing a laser beam to be incident on said scanning means; and
   means for controlling the parameters of said laser to provide sufficient energy to raise the energy level of said coating to a level just below the bonding energy of the coating material to anneal the coating and to drive out contaminant materials therefrom but not to provide enough energy to melt the underlying substrate.

2. Coating apparatus as defined in claim 1, comprising:
   a plurality of support means for supporting a plurality of specimens of coating materials.

3. Coating apparatus as defined in claim 1, further including:
   laser means for providing a laser beam to be directed on said coating material.

4. Coating apparatus as defined in claim 3, wherein:
   a second window is provided in said chamber walls and said specimen is evaporated by means of heating by a laser beam entering the chamber through said second window.

5. Coating apparatus as defined in claim 4, further including:
   means for dividing the beam from said laser means to direct a portion on said specimen and another portion on said substrate.

6. Coating apparatus as defined in claim 2, further including:
   a plurality of windows in the chamber walls;
   laser means for providing a laser beam;
   means for dividing the laser beam to direct portions thereof on each specimen and on said substrate.

7. A coating method comprising the steps of:
   supporting a substrate in a vacuum chamber;
   supporting a specimen of coating material within said chamber;
   evaporating at least a portion of said specimen to provide a coating on said substrate;
   directing a laser beam to scan said coating material on said substrate so as to provide sufficient energy to cause localized heating of the coating material deposited thereon and raise the energy of the coating to a level slightly below the bonding energy of said coating material so as to anneal the coating material and drive out contaminants therefrom but not to provide enough energy to melt the underlying substrate.

* * * * *